US009545045B2

(12) United States Patent
Yamauchi et al.

(10) Patent No.: US 9,545,045 B2
(45) Date of Patent: Jan. 10, 2017

(54) COMPONENT MOUNTING DEVICE AND PRODUCT-TYPE SWITCHING METHOD

(75) Inventors: Satoshi Yamauchi, Yamanashi (JP); Takeyuki Kawase, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 517 days.

(21) Appl. No.: 13/579,717

(22) PCT Filed: Nov. 29, 2011

(86) PCT No.: PCT/JP2011/006650
§ 371 (c)(1),
(2), (4) Date: Aug. 17, 2012

(87) PCT Pub. No.: WO2012/098612
PCT Pub. Date: Jul. 26, 2012

(65) Prior Publication Data
US 2012/0314395 A1    Dec. 13, 2012

(30) Foreign Application Priority Data

Jan. 20, 2011 (JP) ................................. 2011-009655

(51) Int. Cl.
H05K 7/14 (2006.01)
H05K 13/08 (2006.01)
H05K 13/00 (2006.01)

(52) U.S. Cl.
CPC .......... *H05K 13/08* (2013.01); *H05K 13/0061* (2013.01)

(58) Field of Classification Search
USPC ................................................. 700/121, 112
See application file for complete search history.

(56) References Cited

U.S. PATENT DOCUMENTS

2006/0190118 A1* 8/2006 Teferra et al. ................ 700/112
2008/0221723 A1* 9/2008 Lee ............................... 700/112
2011/0179638 A1   7/2011 Nagao

FOREIGN PATENT DOCUMENTS

CN       101273312 A    9/2008
JP       07-202486 A    8/1995
(Continued)

OTHER PUBLICATIONS

Garmin, "Nuvi 205 and 205W series Owner's manual" Jul. 2010. pp. 1-64.*

(Continued)

*Primary Examiner* — Mohammad Ali
*Assistant Examiner* — Emilio J Saavedra
(74) *Attorney, Agent, or Firm* — Pearne & Gordon LLP

(57) ABSTRACT

In the operation execution step wherein the operation switches are clicked to execute the operation related to product-type switching, if the substrate presence/absence detecting sensors S1, S2 that detect the presence/absence of substrates in the front-side substrate transporting mechanism 11A and rear-side substrate transporting mechanism 11B detect the presence of substrates, it is judged that the manufacturing operation of the corresponding substrate type has not ended, and the input control processing is executed so that the input operation by the operation switch for executing the operation related to product-type switching is prohibited. As a result, it is possible to prevent the problems related to reloading of the mounting program before the manufacturing has ended.

4 Claims, 13 Drawing Sheets

(56) References Cited

FOREIGN PATENT DOCUMENTS

| | | | |
|---|---|---|---|
| JP | 2002-076698 | A | 3/2002 |
| JP | 2003-133800 | A | 5/2003 |
| JP | 2009-272562 | A | 11/2009 |
| WO | 2006/081519 | A2 | 8/2006 |
| WO | 2010/038437 | A1 | 4/2010 |

OTHER PUBLICATIONS

International Search Report for PCT/JP2011/006650 dated Jan. 24, 2012.
Chinese Office action for Application No. 201180011571.X dated Jan. 30, 2015.

* cited by examiner

COMPONENT MOUNTING DEVICE AND PRODUCT-TYPE SWITCHING METHOD

TECHNICAL FIELD

The present invention relates to a component mounting device for mounting electronic components on a substrate, and to a product-type switching method whereby the operation processing is carried out when the type of substrate used as the assembly subject is switched in the component mounting device.

BACKGROUND ART

An electronic component mounting system for manufacturing a mounted substrate by mounting electronic components on a substrate takes the substrate prepared by printing the paste for solder bonding as the subject, and has a constitution wherein multiple component mounting devices are connected for mounting the electronic components. In recent years, in the electronics business, with progress in diversification of the manufacturing schemes, the manufacturing scheme of many product types, each with a small quantity, has been on the rise in the component mounting field. Consequently, the frequency of the product-type switching operation that occurs with switching of the types of substrates used as the manufacturing subject is on the rise, and have many schemes been proposed to carry out the product-type switching operation with increased productivity at the manufacturing site of the component mounting operation (for example, see Patent Reference 1). In the prior art described in the patent reference, the component-type information of the current manufacturing lot and that of the next manufacturing lot are compared with each other, and, on the basis of the result of the comparison, the component types shared by the two manufacturing lots and component types that are different for the two manufacturing lots are identified and displayed. As a result, it is possible to make preparation for the component types needed for the next manufacturing lot during the current manufacturing operation.

REFERENCES OF PRIOR ART

Patent References

Patent Reference 1: JP7-A-202486

ABSTRACT OF THE INVENTION

Problem that the Invention is to Solve

Here, the component mounting device refers to a component mounting device having a constitution with two independent mounting lanes composed of a substrate transporting mechanism for transporting substrates and a component mounting mechanism for mounting the components on the substrate. With the constitution, two different types of substrates are taken as the subjects by the two mounting lanes, and it is possible to execute the mounting operation of the components simultaneously, and parallel with each other. However, for the component mounting device with the constitution, the timing for the end of each manufacturing lot is different for different mounting lanes, so that it is necessary to carry out the product-type switching operation that occurs with a change of the substrate type for each mounting lane. Consequently, in order to improve the operability of the device; there is a demand for the development of a scheme wherein the product-type switching operation is carried out only for the mounting lane that has the manufacturing-lot ended without stopping the operation of the mounting lane that continues the manufacturing operation.

During the product-type switching operation, the component supplying devices, such as the tape feeder, etc. that supply the components to the component mounting mechanism and the hardware, such as a sucking nozzle, etc., adopted in the component mounting mechanism are exchanged; at the same time, the software, such as the mounting program, etc., adopted in manufacturing the various types of the substrates is also exchanged. After the end of manufacturing of one type of substrate, the operator carries out the data exchange operation by downloading the mounting program corresponding to the next type for manufacturing from a high-order computer.

However, for the mounting lane that continues manufacturing, too, if a certain abnormality in the operation takes place, or if it is necessary to input data, the operation of the mounting lane should be stopped. This operation-down state may be mixed in with the stop of operation after the end of manufacturing, so that the operator may mistakenly think that the manufacturing has ended, although the manufacturing actually continues. In such a case, if the data exchange operation is executed at the time the product-type switching operation, although manufacturing has not ended for the type of substrate being used in manufacturing, the mounting program is reloaded, which is undesirable.

The purpose of the present invention is to solve the problems of the prior art, in which the mounting program is reloaded although manufacturing has not been ended, by providing a component mounting device and a product-type switching method for the component mounting device.

Means for Solving the Problem

The component mounting device of the present invention has the following sections: a first substrate transporting mechanism and a second substrate transporting mechanism, which transport the substrates received from the upstream device in the substrate transporting direction, and which have substrate holding sections that position and hold the substrates, respectively: a substrate presence/absence detecting section that detects the presence/absence of substrates in the first substrate transporting mechanism and the second substrate transporting mechanism; a first component supplying section and a second component supplying section arranged on the sides of the first substrate transporting mechanism and the second substrate transporting mechanism, respectively, for supplying the components to be mounted on the substrates; a first component mounting mechanism and a second component mounting mechanism, which fetch the components from the first component supplying section and the second component supplying section arranged corresponding to the first substrate transporting mechanism and the second substrate transporting mechanism, respectively, and have them mounted on the substrates held in the substrate holding section of the first substrate transporting mechanism and the substrate holding section of the second substrate transporting mechanism, respectively; an operation panel that can perform input operation for any of the following mounting lanes taken as the subject: the first mounting lane comprising the first substrate transporting mechanism, the first component supplying section, and the first component mounting mechanism, along with the second mounting lane comprising the second substrate transporting mechanism, the second component supplying section, and the second component mounting mechanism; operation switches arranged on the operation panel and that include a lane specifying switch that specifies the mounting lane as the subject of the input operation, a stop switch for shutting off the operation of the device for the specified mounting lane, and a product-type switching switch for carrying out the section exchange operation at the time of exchange of the type of substrate as the mounting subject; an input control processing section that controls the input operation carried out via the operation switches; with the input control processing section, the input control processing is carried out, that is, the operator operates the operation panel to specify the subject mounting lane as the subject of the operation by the lane specifying switch; after the operation of the subject mounting lane that has been specified is stopped, the product-type switching operation is operated so as to execute the product-type switching operation processing that sets the operation switches for executing the operations related to the product-type switching to be ready for operation with the subject mounting lane as the subject, and, at the same time, if the substrate presence/absence detecting section detects presence of the substrate, the input operation by the operation switch for executing the operation related to the product-type switching is prohibited.

The product-type switching method in the component mounting device of the present invention has the following features: the method is adopted for the component mounting device having the following sections: a first substrate transporting mechanism and a second substrate transporting mechanism, which transport the substrates received from the upstream device in the substrate transporting direction, and which have substrate holding sections that position and hold the substrates, respectively; a substrate presence/absence detecting section that detects the presence/absence of substrates in the first substrate transporting mechanism and the second substrate transporting mechanism; a first component supplying section and a second component supplying section arranged on the sides of the first substrate transporting mechanism and the second substrate transporting mechanism, respectively, for supplying the components to be mounted on the substrates; a first component mounting mechanism and a second component mounting mechanism, which fetch the components from the first component supplying section and the second component supplying section arranged corresponding to the first substrate transporting mechanism and the second substrate transporting mechanism, respectively, and have them mounted on the substrates held in the substrate holding section of the first substrate transporting mechanism and the substrate holding section of the second substrate transporting mechanism, respectively; an operation panel that can perform input operation for any of the following mounting lanes taken as the subject: the first mounting lane comprising the first substrate transporting mechanism, the first component supplying section, and the first component mounting mechanism, along with the second mounting lane comprising the second substrate transporting mechanism, the second component supplying section, and the second component mounting mechanism; operation switches arranged on the operation panel and that include a lane specifying switch that specifies the mounting lane as the subject of the input operation, a stop switch for shutting off the operation of the device for the specified mounting lane, and a product-type switching switch for carrying out the section exchange operation at the time of exchange of the type of the substrate as the mounting subject; and an input control processing section that controls the input operation carried out via the operation switches. According to the product-type switching method for product-type switching of the substrates, there are the following steps of operation: a step in which the operator operates the operation panel to specify the subject mounting lane as the subject of the operation by the lane specifying switch; a step carried out for product-type switching, in which after the operation of the subject mounting lane that has been specified is stopped, the product-type switching operation is operated so as to execute the product-type switching operation processing that sets the operation switches for executing the operations related to the product-type switching to be ready for operation with the mounting lane as the subject; and an operation execution step in which the operation switches are manipulated to execute the operation related to the product-type switching. In the operation execution step, if the substrate presence/absence detecting section detects the presence of the substrate, the input operation by the operation switch for executing the operation related to the product-type switching is prohibited.

Effects of the Invention

According to the present invention, in the operation execution step in which the operation related to the product-type switching is executed by manipulating the operation switches, if the substrate presence/absence detecting section for detecting the presence/absence of substrates in the first substrate transporting mechanism and the second substrate transporting mechanism detects the presence of the substrate, the input control processing is carried out so that the input operation by the operation switch for executing the operation related to the product-type switching is prohibited. As a result, it is possible to prevent the problems caused by reloading of the mounting program although the manufacturing operation has not ended.

BEST MODE FOR CARRYING OUT THE INVENTION

Figure 1:
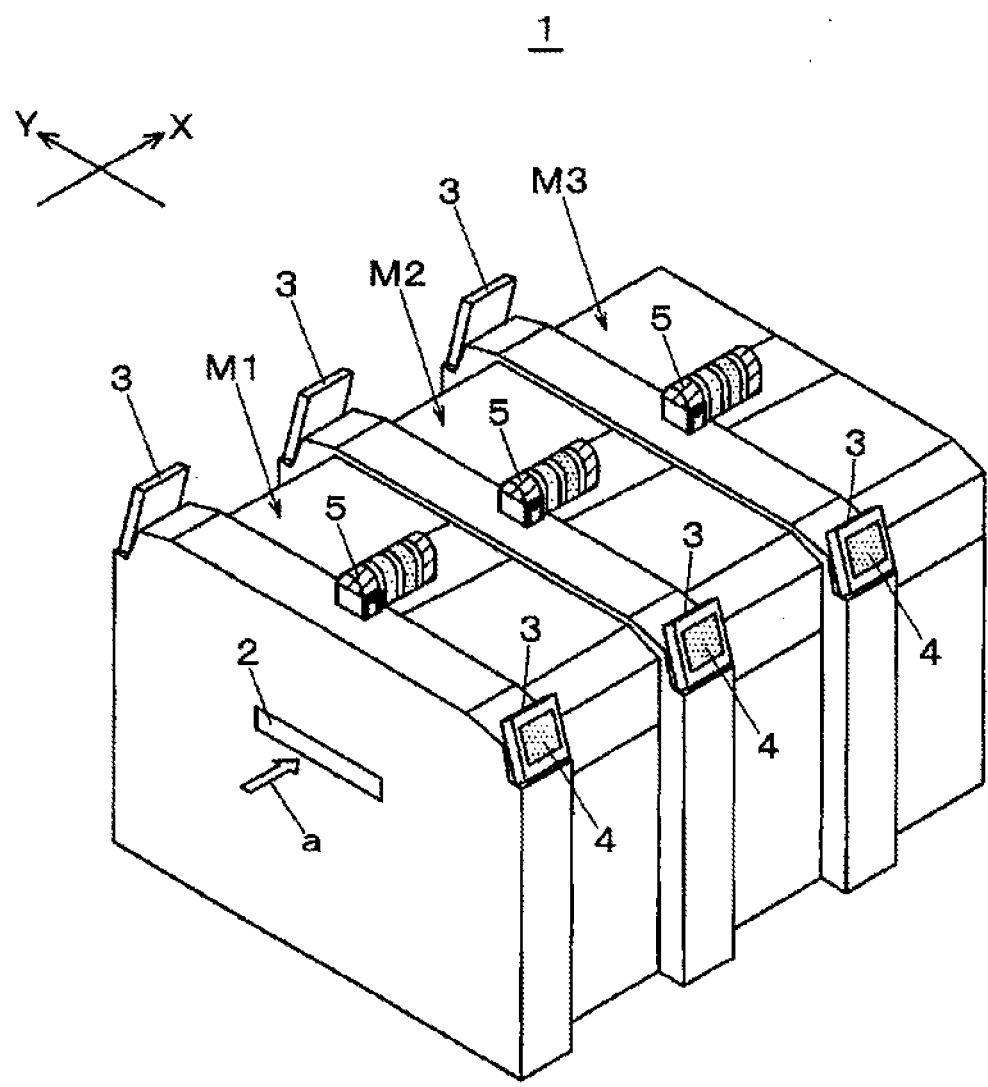
FIG. 1 is an oblique view illustrating the constitution of the component mounting system in an embodiment of the present invention.

In the following, the embodiment of the present invention will be explained with reference to figures. First of all, the constitution of the component mounting system 1 will be explained with reference to FIGS. 1 and 2. Here, the component mounting system 1 comprises a number (3 in this example) of component mounting devices M1, M2, M3 connected in tandem, and it has the function of mounting components on substrates to manufacture mounted substrates. As shown in FIG. 2, the component mounting system 1 has a first mounting lane L1 and a second mounting lane L2, which can independently work respectively. Each substrate as the mounting subject fed from the upstream-side (indicated by arrow a) is transferred via a transporting opening 2 formed on the component mounting device M1 located at the upstream most position to the substrate transporting mechanism arranged inside the device (see the front-side substrate transporting mechanism 11A and the rear-side substrate transporting mechanism 11B shown in FIG. 2); the substrates are sequentially carried in the X-direction (the substrate transporting direction) in the component mounting system 1. The substrate that has been carried in becomes the subject of the component mounting operation by the various devices, and the substrate after the component mounting operation is carried out to the downstream device.

On the side surface of each of the component mounting devices M1 through M3, an operation panel 3 is arranged corresponding to each of the first mounting lane L1 and the second mounting lane L2. Here, each operation panel 3 is equipped with a liquid crystal panel or other operation panel 4; the other operation panel 4 has an operation picture 30 displayed for input operation to manipulate the various devices (see FIG. 4). On the top surface of each of the component mounting devices M1 through M3, a signal tower 5 is arranged; the signal tower 5 displays the state of operation of the various devices by signal lamps in different colors.

In the following, the constitution of the component mounting devices M1 through M3 will be explained. Here, since the component mounting devices M1 through M3 have the same constitution, only the component mounting device M1 will be explained with keys applied for it, while an explanation will not be repeated for the component mounting devices M2 and M3. As shown in FIG. 2, at the central portion of the table 10, a front-side substrate transporting mechanism 11A (the second substrate transporting mechanism) and a rear-side substrate transporting mechanism 11B (the first substrate transporting mechanism) are arranged in the X-direction (the substrate transporting direction). Here, the lower side of the figure corresponds to the front side, while the upper side of the figure corresponds to the rear side. The front-side substrate transporting mechanism 11A and rear-side substrate transporting mechanism 11B transport the substrates 6 received from the upstream device to the downstream side in the X-direction. Each of the front-side substrate transporting mechanism 11A and rear-side substrate transporting mechanism 11B has a substrate holding section 7, and each substrate 6 transported from the upstream side is positioned and held at the mounting operation position in the substrate holding section 7 by a component mounting mechanism to be explained later. Each substrate holding section 7 has sensors S1, S2 for detecting the presence/absence of substrate attached on it. The substrate presence/absence detecting sensors S1, S2 use optical means in detecting the presence/absence of the substrate 6 in the substrate holding section 7. That is, the substrate presence/absence detecting sensors S1, S2 work as substrate presence/absence detecting sections that detect the presence/absence of substrates 6 in the front-side substrate transporting mechanism 11A and the rear-side substrate transporting mechanism 11B.

On the outer side of each of the front-side substrate transporting mechanism 11A and rear-side substrate transporting mechanism 11B, a front side component supplying section 12A (the first component supplying section) and a rear side component supplying section 12B (the second component supplying section) for supplying components for mounting onto the substrates 6 are arranged. Each of the front side component supplying section 12A and rear side component supplying section 12B has multiple tape feeders 13 arranged side-by-side. Here, the tape feeders 13 feed the components to the component fetching position by a component mounting mechanism as the carrier tapes for accommodating and holding the components are pitch fed.

On one end portion of the table 10 in the X-direction, a Y-axis moving table 14 having a linear driving mechanism is arranged horizontally in the Y direction. On the Y-axis moving table 14, two X-axis moving tables 15A, 15B also having the linear driving mechanism are combined. On the X-axis moving tables 15A, 15B, the front side mounting head 17A (the first mounting head) and the rear side mounting head 17B (the second mounting head) are installed such that they can move freely in the X-direction. The Y-axis moving table 14 and X-axis moving table 15A form the front-side head moving mechanism 16A, and the Y-axis moving table 14 and the X-axis moving table 15B from the rear-side head moving mechanism 16B, respectively. By driving the front-side head moving mechanism 16A and rear-side head moving mechanism 16B, the front side mounting head 17A and rear side mounting head 17B are driven to move horizontally in the X-direction and Y-direction, so that components are fetched from the tape feeders 13 of the front side component supplying section 12A and the rear side component supplying section 12B, respectively, and have them mounted on the substrates 6 positioned and held in the substrate holding sections 7 of the front-side substrate transporting mechanism 11A and rear-side substrate transporting mechanism 11B (see the thick line arrows that connect the front side mounting head 17A and the front-side substrate transporting mechanism 11A and the connect the rear side mounting head 17B and the rear-side substrate transporting mechanism 11B, respectively).

That is, the combination of the front-side head moving mechanism 16A and the front side mounting head 17A is arranged corresponding to the front-side substrate transporting mechanism 11A (the first substrate transporting mechanism), and the combination of the rear-side head moving mechanism 16B and the rear side mounting head 17B is arranged corresponding to the rear-side substrate transporting mechanism 11B (the second substrate transporting mechanism). These head moving mechanisms and mounting heads form the first component mounting mechanism and the second component mounting mechanism, which fetch the components from the front side component supplying section 12A (the first component supplying section) and the rear side component supplying section 12B (the second component supplying section), and assemble them on the substrates 6 held in the substrate holding sections 7 of the front-side substrate transporting mechanism 11A and the rear-side substrate transporting mechanism 11B, respectively.

On the lower surface side of the X-axis moving table 15A and the X-axis moving table 15B, substrate recognition cameras 8 are arranged and can monolithically move together with the front side mounting head 17A and the rear side mounting head 17B, respectively. As the front side mounting head 17A and the rear side mounting head 17B are driven to move on the substrates 6 of the front-side substrate transporting mechanism 11A and the rear-side substrate transporting mechanism 11B, the substrate recognition cameras 8 take pictures of the substrates 6, respectively. Also, component recognition cameras 9 are arranged between the front side component supplying section 12A, the front-side substrate transporting mechanism 11A, the rear side component supplying section 12B, and the rear-side substrate transporting mechanism 11B, respectively. As the front side mounting head 17A and the rear side mounting head 17B, which fetched the components from the front side component supplying section 12A and the rear side component supplying section 12B, are driven to move over the component recognition cameras 9, the component recognition cameras 9 take pictures of the components as the components are held on the front side mounting head 17A and the rear side mounting head 17B, respectively.

The results of the image pickup by the substrate recognition cameras 8 are subject to recognition processing, so that the component mounting position of each substrate 6 is recognized. Because the results of image pickup of substrate recognition cameras 8 are subject to recognition processing, the components while kept on the front side mounting head 17A and the rear side mounting head 17B are recognized, and their shifts in position are detected. These recognition results are taken into consideration to correct the carrying positions in the component mounting operation by the first component mounting mechanism and the second component mounting mechanism.

In the component mounting system 1, the front-side substrate transporting mechanism 11A, the front side component supplying section 12A, the front-side head moving mechanism 16A and the front side mounting head 17A of each of the component mounting devices M1 through M3 form the first mounting lane L1 that executes the component mounting operation for the substrates 6 transported along the series of substrate transporting lanes connected with the front-side substrate transporting mechanism 11A. Similarly, the rear-side substrate transporting mechanism 11B, the rear side component supplying section 12B, the rear-side head moving mechanism 16B, and the rear side mounting head 17B of each of the component mounting devices M1 through M3 form the second mounting lane L2 that executes the component mounting operation for the substrates 6 transported along the series of substrate transporting lanes connected with the rear-side substrate transporting mechanism 11B.

Figure 2:
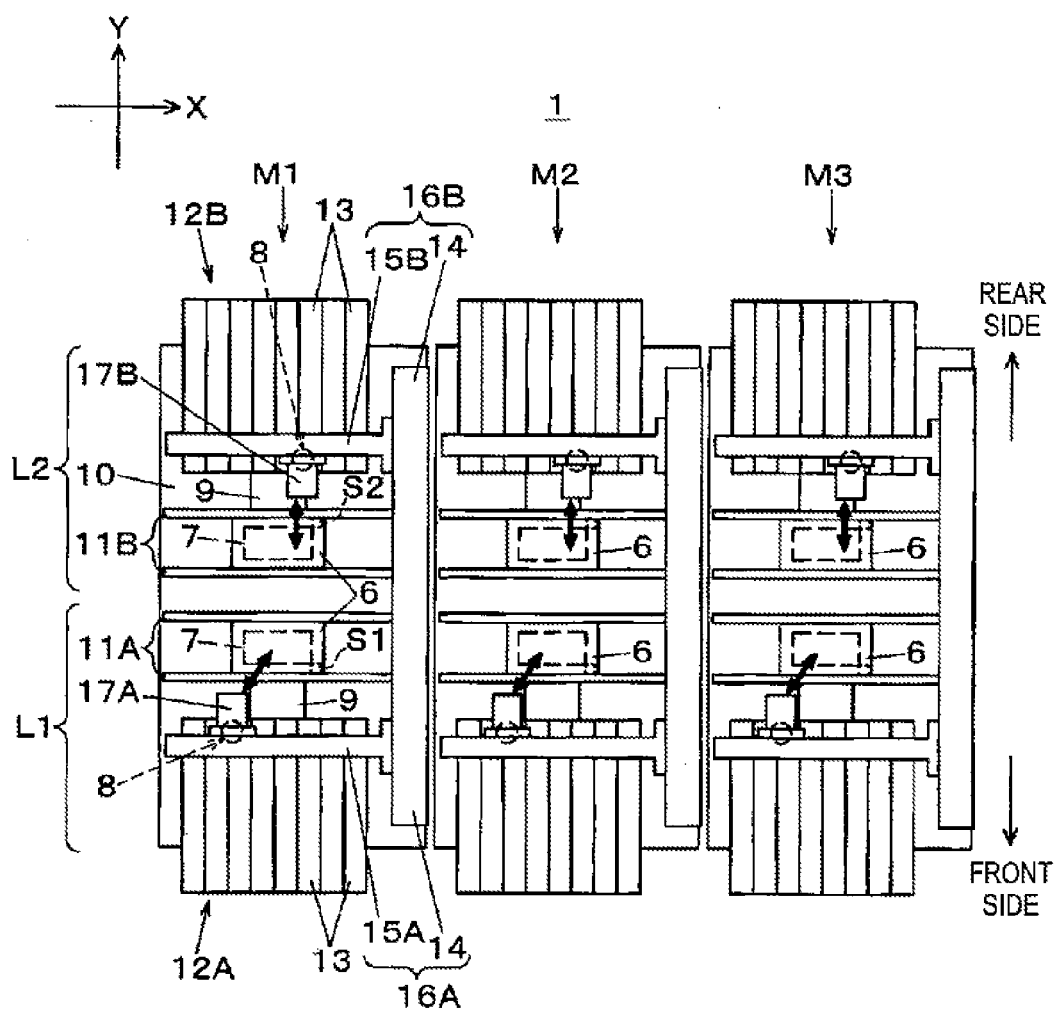
FIG. 2 is a plane view illustrating the component mounting system in an embodiment of the present invention.

As shown in FIG. 1, the operation panel 3 arranged for each of the component mounting devices M1 through M3 is set on the side surface corresponding to each of the first mounting lane L1 and the second mounting lane L2. Here, for the component mounting system 1 in this embodiment, the two operation panels 3 can perform input operation with either the first mounting lane L1 or the second mounting lane L2 as the subject in the device. That is, when it becomes necessary for the operator who is carrying out an operation on the front side of the device to perform input operation for the second mounting lane L2 located on the rear side, without moving his/her own operation position, the operator can perform the necessary input operation via the front side operation panel 3 currently in front of him/her.

Similarly, when the operator is carrying out an operation on the rear side, if it becomes necessary to perform input operation for the first mounting lane L1 located on the front side, the operator can carry out the necessary input operation via the operation panel 3 currently on the rear side. According to this embodiment, as an example, two operation panels 3 are arranged for each of the devices arranged corresponding to the first mounting lane L1 and the second mounting lane L2. However, one may also adopt a scheme in which one operation panel 3 is arranged that can change its orientation to both the front/rear sides for each device.

Figure 3:
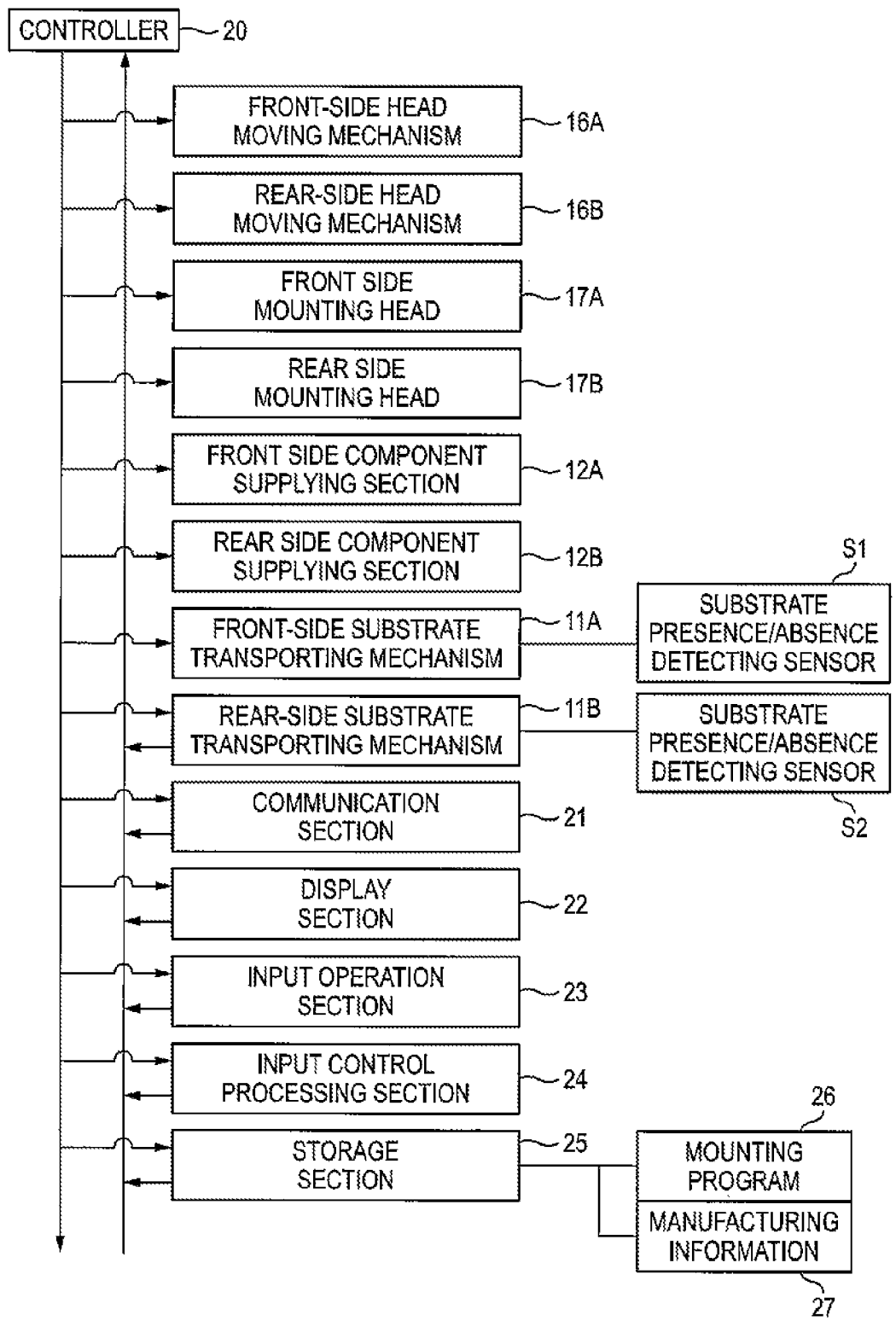
FIG. 3 is a block diagram illustrating the constitution of the control system of the component mounting device in an embodiment of the present invention.

In the following, the constitution of the control system will be explained with reference to FIG. 3. As shown in FIG. 3, the controller 20 controls the following sections that form the component mounting devices M1 through M3, respectively. Because the controller 20 controls the front-side head moving mechanism 16A, the front side mounting head 17A, and the front side component supplying section 12A, the first mounting lane L1 is taken as the subject mounting lane, and the component mounting operation is executed for the substrate 6 carried in to the front-side substrate transporting mechanism 11A. Also, because the controller 20 controls the rear-side head moving mechanism 16B, the rear side mounting head 17B, and the rear side component supplying section 12B, the second mounting lane L2 is taken as the subject mounting lane, and the component mounting operation is carried out for the substrate 6 carried in to the rear-side substrate transporting mechanism 11B.

In this case, the controller 20 controls the first mounting lane L1 and second mounting lane L2 individually, so that the component mounting operation can be carried out independently in each of the first mounting lane L1 and second mounting lane L2. That is, even when the mounting lane on one side is stopped due to the product-type switching operation at the time of a change in the type of substrate, the other mounting lane still can continue the component mounting operation. Here, the substrates 6 carried in by the front-side substrate transporting mechanism 11A and the rear-side substrate transporting mechanism 11B are detected by the substrate presence/absence detecting sensors S1, S2, respectively. The results of detection are sent to the controller 20 and, on the basis of the detection results, the controller 20 executes the input control processing to prohibit the input operation by the operation switch for executing the operation related to the product-type switching as to be explained later.

The communication section 21 is connected with the other devices via a LAN system (not shown in the figure), and it carries out the transfer of control signals and data with the other devices. The display section 22 carries out processing to display the operation picture and various types of notification pictures, as well as and other pictures on the operation panel 4 set on the operation panel 3. The input operation section 23 is an input means, such as a touch panel switch or the like, set on the operation panel 4. It works in case of the input operation for operation of the device and input of the manufacturing data, etc. The input control processing section 24 carries out processing for the input operation performed via the operation switches that form the input operation section 23. The detailed functions of the input control processing section 24 will be described later together with the constitution and function of the operation picture 30 shown in FIG. 4 through FIG. 10. The storage section 25 stores the mounting program 26 and the manufacturing information 27 needed for executing the substrate transporting operation and the component mounting operation.

Figure 4:
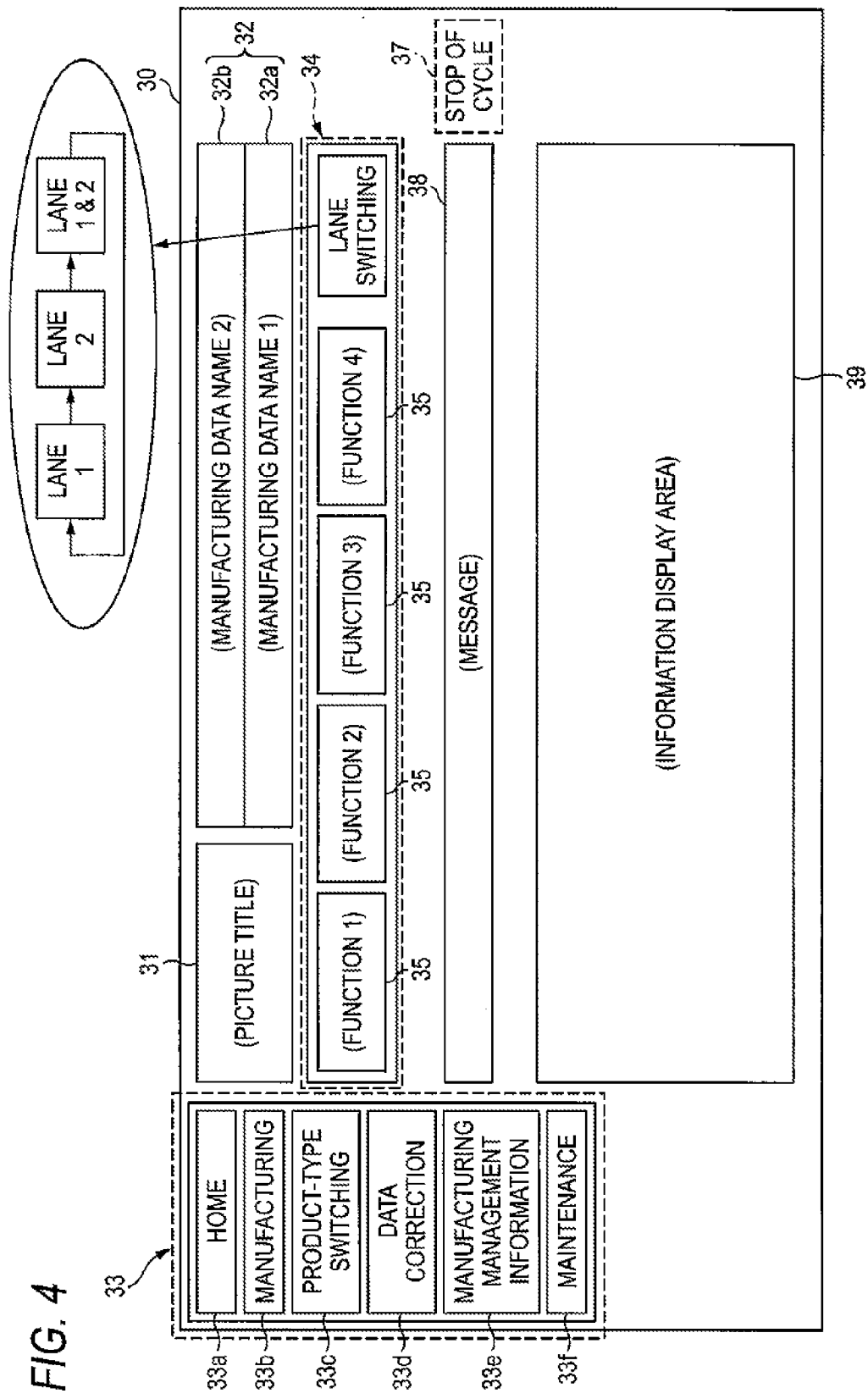
FIG. 4 is a diagram illustrating the constitution and function of the operation picture on the component mounting device in an embodiment of the present invention.

In the following, the constitution and detailed function of the operation picture 30 displayed on the operation panel 4 will be explained with reference to FIG. 4. As shown in FIG. 4, the operation picture 30 comprises the picture title 31 that shows the content displayed as information, manufacturing data 32 indicating the type of substrate as the manufacturing subject, the first operation switch frame 33 that hierarchically displays the touch panel switches set in the picture, the second operation switch frame 34 and the message frame 38, and the information display area 39.

The picture title 31 displays the contents of the specific information for display in the information display area 39 corresponding to the input operation by the various operation switches displayed in the first operation switch frame 33 and the second operation switch frame 34. The manufacturing data 32 display the "manufacturing data name 1" 32a and the "manufacturing data name 2" 32b indicating the type of substrate that becomes the manufacturing subject in the first mounting lane L1 and the second mounting lane L2, respectively. The first operation switch frame 33 displays the first hierarchical operation switches that have the contents of the information to be displayed on the operation picture 30 classified in many classes. The first hierarchical operation switches include the "home" 33a, the "manufacturing" 33b, the "product-type switching" 33c, the "data correction" 33d, the "manufacturing management information" 33e, and the "maintenance" 33f.

As the "home" 33a is clicked, the initial picture is displayed on the operation picture 30. When the "manufacturing" 33b is clicked, the information related to the manufacturing operation for mounting the components on the substrate, that is, the information related to execution of a component mounting operation, is displayed. The "product-type switching" 33c is a product-type exchange switch. As the "product-type switching" 33c is clicked, the information related to execution of the product-type switching operation for changing the type of substrate as the manufacturing subject is displayed. As the "data correction" 33d is clicked, it is possible to make appropriate correction for the various types of data and other data for use in the component mounting operation during the manufacturing operation. As the "manufacturing management information" 33e and the "maintenance" 33f are clicked, respectively, the information related to the manufacturing management, such as the manufacturing plan and manufacturing results, etc., in the device, as well as the information related to the history of the service operation for the device and the manufacturing plan and other device maintenance operations are displayed, respectively.

In the second operation switch frame 34, multiple function switches 35 (functions 1 through 4) and the lane specifying switch 36 are displayed. Here, as the function switches 35, the following operation switches with the operation contents having functions corresponding to the "home" 33a, the "manufacturing" 33b, the "product-type switching" 33c, the "manufacturing management information" 33e, and the "maintenance" 33f that are selected and clicked by means of the first operation switch frame 33 are displayed. The lane specifying switch 36 is an operation switch for specifying the mounting lane as the subject of the input operation by the operation picture 30. As the lane specifying switch 36 is clicked, it is possible to switch the subject of the input operation to only the first mounting lane L1, only the second mounting lane L2, or both the first mounting lane L1 and the second mounting lane L2.

The stop switch 37 is also an operation switch of the touch panel switch system. As the stop switch 37 is clicked, the operation in the mounting lane is stopped at the time that one cycle of the component mounting operation being executed is ended. In the message frame 38, the notification to the operator or the message as an introduction or caution notice is displayed as needed. In the information display area 39, as the operation switches displayed in the first operation switch frame 33 and the second operation switch frame 34 are sequentially selected and clicked, the specified display contents, that is, the detailed information of the text information, figures, graphs, etc., indicating the contents displayed on the picture title 31, are displayed.

On the operation picture 30 displayed on the operation panel 4 shown in this embodiment, multiple operation switches including the lane specifying switch 36 that specifies the mounting lane as the subject of the input operation, the stop switch 37 for stopping operation of the device of the mounting lane that has been specified, and the "product-type switching" 33c as the product-type switching switch for carrying out the section exchange operation along with exchange of the type of substrate as the mounting subject are set in the touch panel switch system. In the embodiment, the touch panel switches set on the operation picture 30 are adopted as the operation switches. However, the type of operation switch is not limited to the touch panel switch. The pushbutton or snap switch and other mechanically operated switches may also be used. In this case, on the operation picture 30, a picture specifying the functions and configuration of the mechanically operated switches is displayed.

Figure 5:
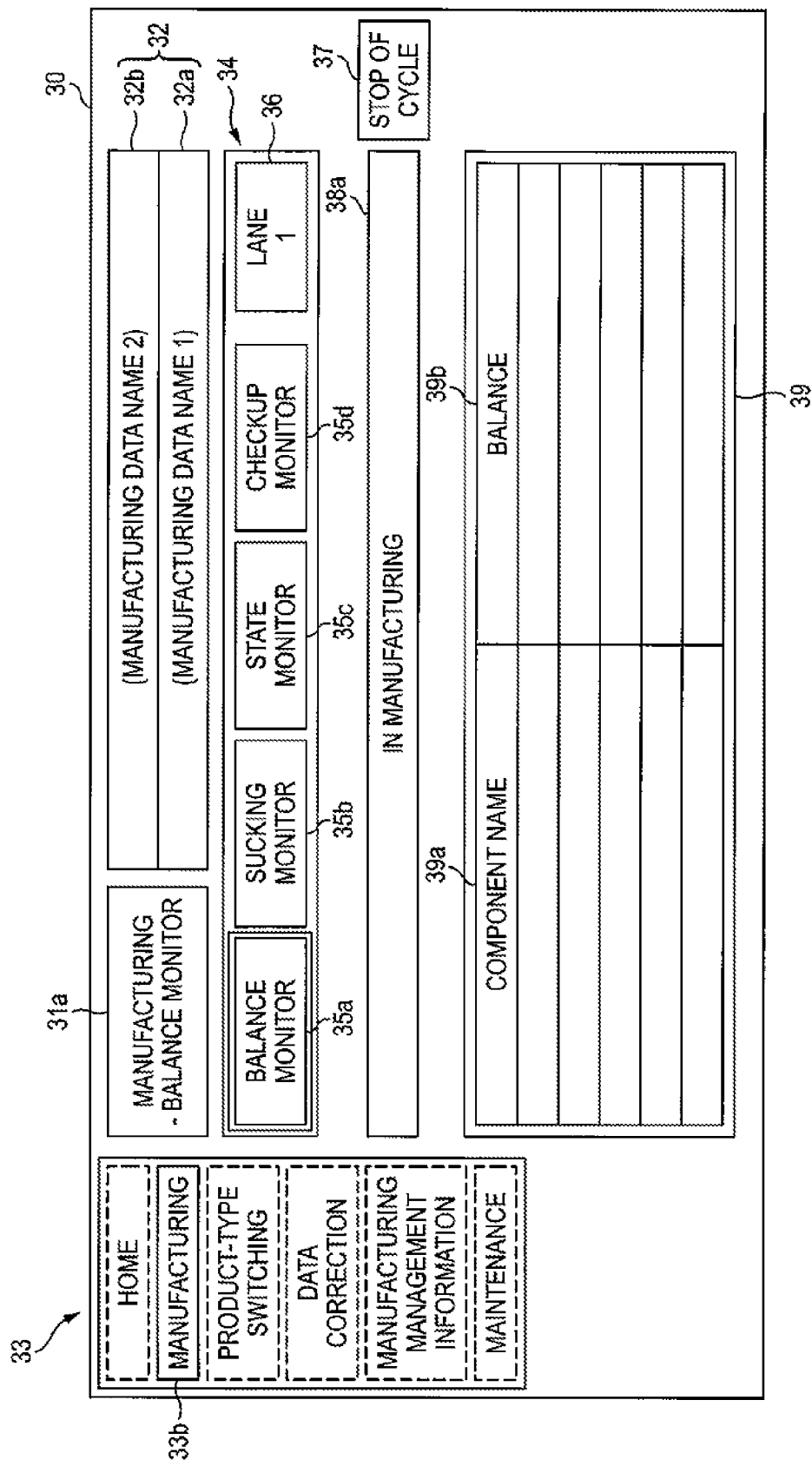
FIG. 5 is a diagram illustrating the operation sequence of the operation picture in the component mounting device in an embodiment of the present invention.
Figure 6:
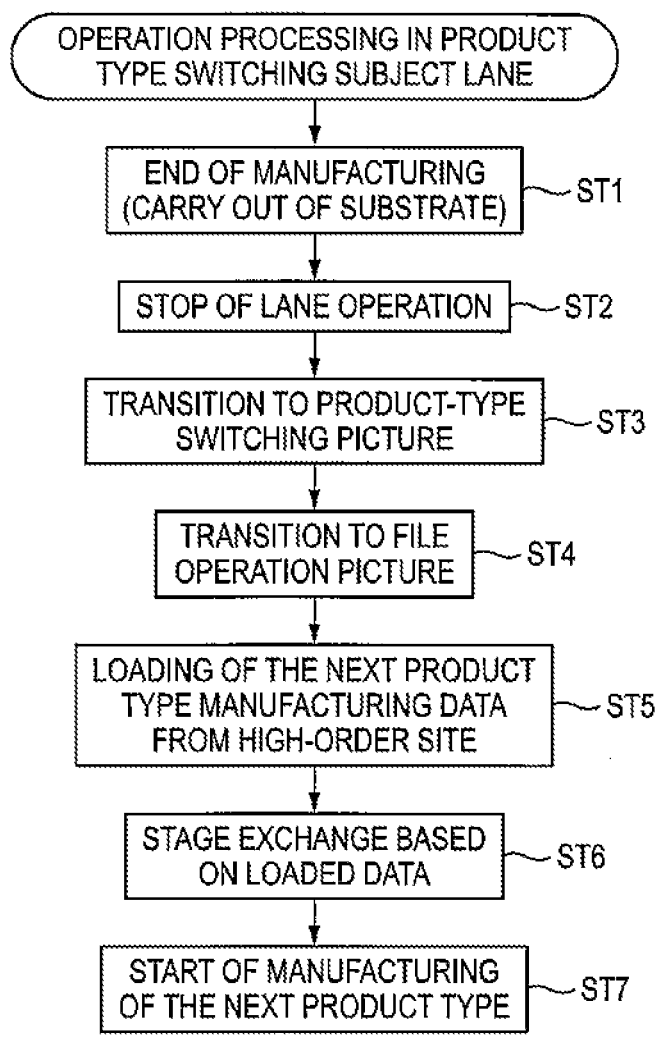
FIG. 6 is a flow chart illustrating the operation processing in the product-type switching subject lane in the component mounting device in an embodiment of the present invention.
Figure 7:
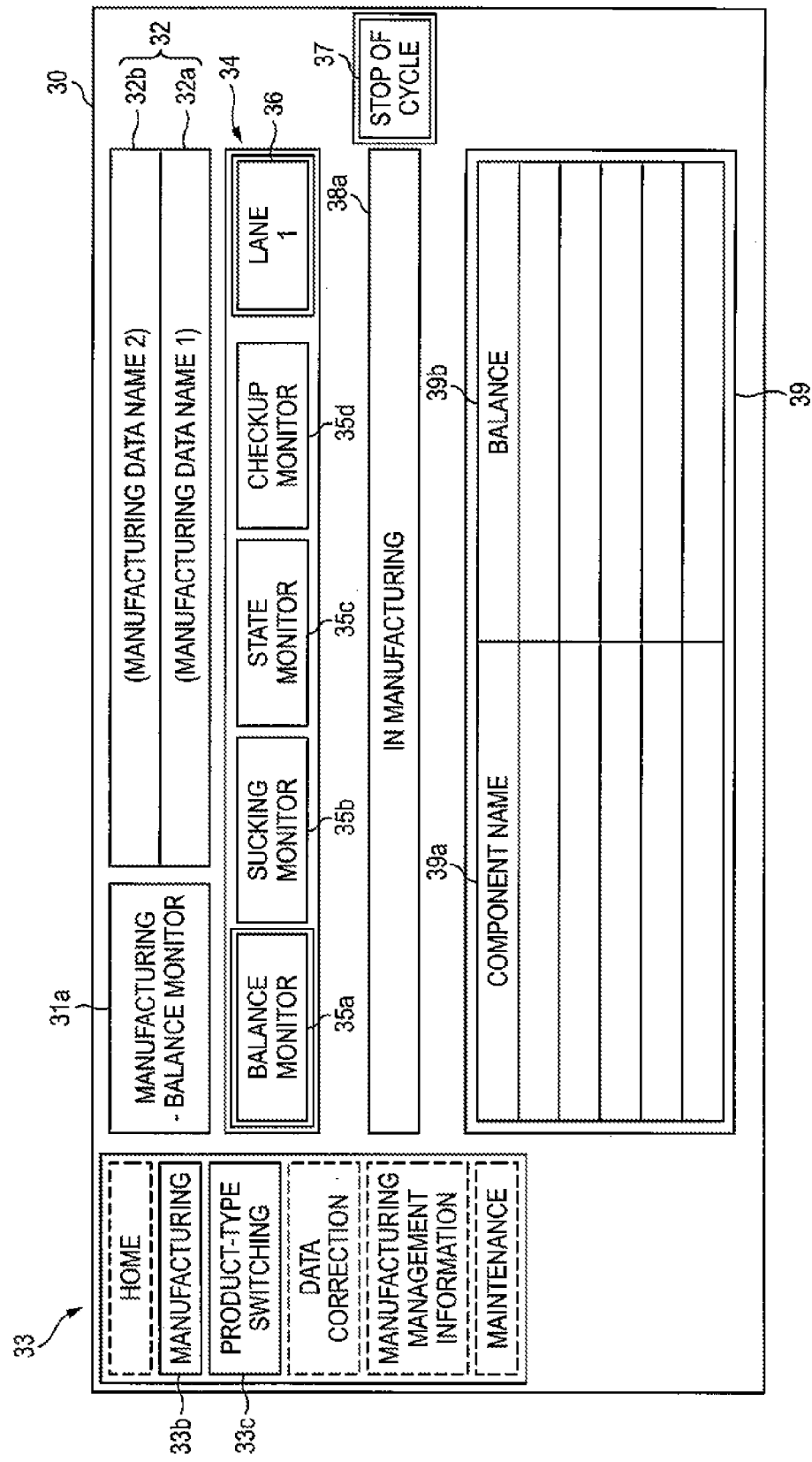
FIG. 7 is a diagram illustrating the operation sequence of the operation picture in the component mounting device in an embodiment of the present invention.

In the following, with reference to FIG. 5 through FIG. 9, an explanation will be made on the operation contents and operation sequence executed on the operation picture 30 when the product-type switching operation is executed in a prescribed mounting lane during continuous manufacturing using the component mounting devices M1 through M3 that form the component mounting system 1. FIG. 5 is a diagram illustrating an example of the display of the operation picture 30 when automatic manufacturing is carried out with the substrate types specified by the "manufacturing data name 1" 32a and the "manufacturing data name 2" 32b in the first mounting lane L1 and second mounting lane L2 as the subjects, respectively.

Here, suppose in the first operation switch frame 33, the "manufacturing" 33b is selected. Corresponding to the selected content, in the second operation switch frame 34, as the function switches 35, the "balance monitor" 35a, the "adsorption monitor" 35b, the "state monitor" 35c, and the "inspection monitor" 35d are displayed; at the same time, "in manufacturing" 38a indicating that manufacturing is being carried out is displayed in the message frame 38. Here, the "balance monitor" 35a, "adsorption monitor" 35b, "state monitor" 35c and "inspection monitor" 35d are operation switches for taking as a reference the information about the following items: setting of parameters, such as the balance of the components in the component supplying section, the type of nozzle for component sucking in the mounting head, the sucking vacuum level, etc., state of operation of the device, checkup executed by the device, etc., respectively. In the example shown in FIG. 5, as the "balance monitor" 35a is clicked, the "manufacturing—balance monitor" 31a is displayed corresponding to the selected content as the picture title 31. In addition, in the information display area 39, the balance component table corresponding to the balance 39b for each component name 39a is displayed.

In the following, an explanation will be made on the operation processing executed while the automatic manufacturing operation is continued in the second mounting lane L2 for the product-type switching operation, with the type of the substrate to be manufactured next as the subject, after the end of the prescribed manufacturing amount in one mounting lane (the first mounting lane L1 in this example) where the manufacturing is being carried out continuously. First of all, after the end of manufacturing in the first mounting lane L1, the substrate at the lot-end is carried out (ST1). The lane operation of the first mounting lane L1 as the subject of the product-type switching is then turned off (ST2). Next, on the operation picture 30 shown in FIG. 7, first of all, in the first operation switch frame 33, the "product-type switching" 33c is set to allow selection. In the second operation switch frame 34, the lane specifying switch 36 for specifying the mounting lane as the subject for the product-type switching is then clicked, so that the first mounting lane L1 is specified and, at the same time, the stop switch 37 is clicked. As a result, the movable function of the side of the first mounting lane L1 of the component mounting devices M1 through M3 is stopped after the end of 1 cycle of the component mounting operation in the first mounting lane L1, and the product-type switching operation with the first mounting lane L1 as the subject is set as executable.

Figure 8:
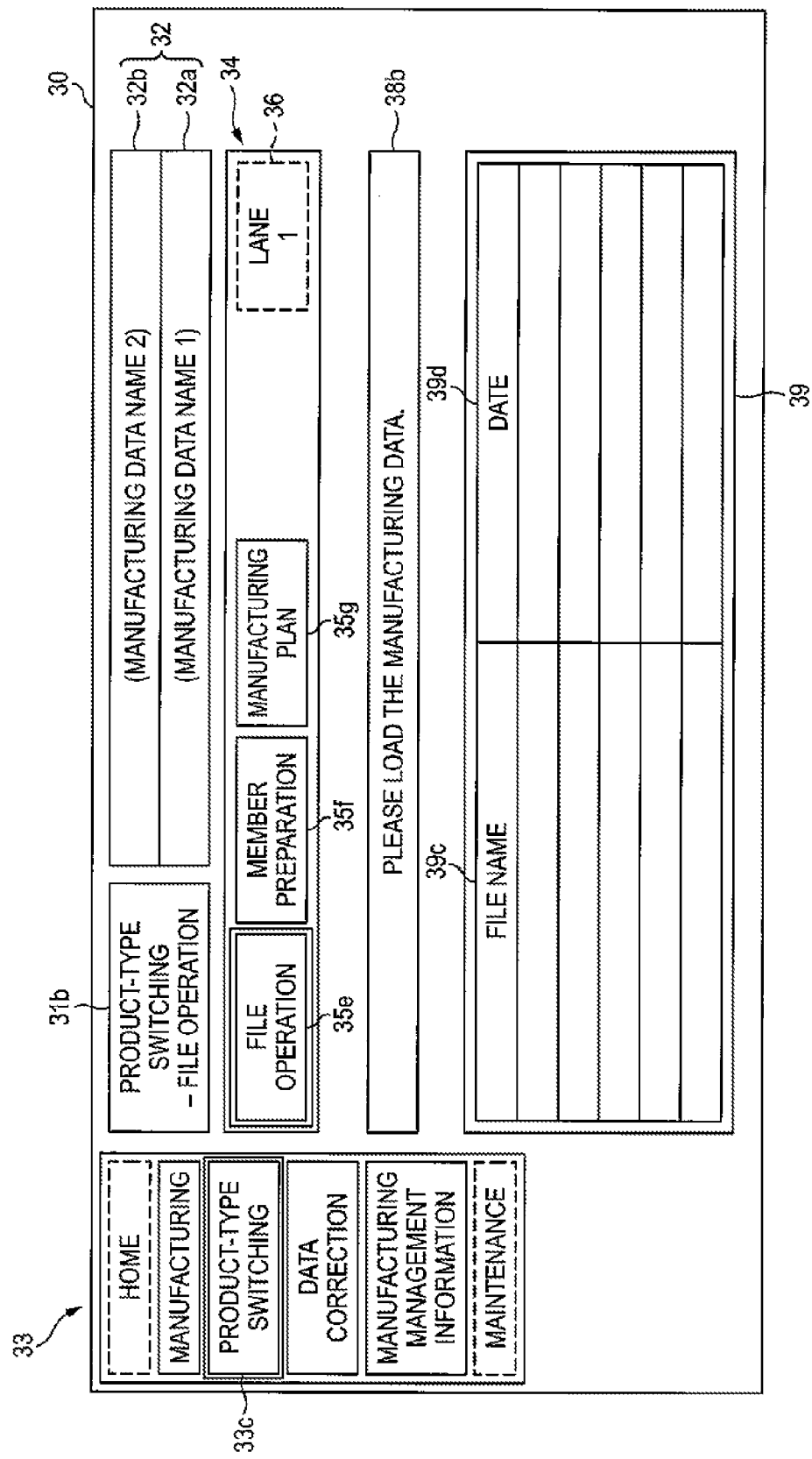
FIG. 8 is a diagram illustrating the operation sequence of the operation picture in the component mounting device in an embodiment of the present invention.

Next, as shown in FIG. 8, the "product-type switching" 33c in the first operation switch frame 33 is clicked. As a result, in the second operation switch frame 34, the "file operation" 35e, "component preparation" 35f, and "manufacturing plan" 35g are displayed as the operation switches for executing the operation related to the product-type switching, and these operation switches are set in the operable state. Here, an example in which the "file operation" 35e in the second operation switch frame 34 is selected and clicked is presented. As a result, as the picture title 31, the "product-type switching—file operation" 31b is displayed and, in the message frame 38, the "please load the manufacturing data" 38b for prompting downloading of the file corresponding to the type of substrate in the next manufacturing operation is displayed. Next, in the information display area 39, a download history table having the file name 39c and the date 39d listed corresponding to each other is displayed. As the "component preparation" 35f and the "manufacturing plan" 35g are sequentially selected and clicked, it is possible to take as a reference the information on the component corresponding to the type of substrate for the next manufacturing operation and the manufacturing quantity and other information, so that the operator can execute the product-type switching operation.

The input control processing is executed by the input control processing section 24. That is, according to the input control processing section 24, the operator manipulates the operation panel 4 to specify the subject mounting lane as the subject of the operation by the lane specifying switch 36; after stopped of the operation of the subject mounting lane that has been specified, the "product-type switching" 33c is clicked to execute the product-type switching operation processing that sets the operable state for the operation switches (the "file operation" 35e, "component preparation" 35f, and "manufacturing plan" 35g) for executing the operation related to the product-type switching with the subject mounting lane as the subject.

Together with the operation processing for product-type switching, the input control processing section 24 takes the operation state of the second mounting lane L2 as a reference. When the second mounting lane L2 executes the component mounting operation, processing is carried out to prohibit the operation by the lane specifying switch 36. That is, the operator containing now clicks the lane specifying switch 36 to specify the second mounting lane L2 as the operation subject, and the mounting lane of the operation subject is fixed at the first mounting lane L1. In this case, only the operation switches (the "file operation" 35e, "component preparation" 35f, and "manufacturing plan" 35g) can be manipulated with the first mounting lane L1 as the subject, and the product-type switching operation with the first mounting lane L1 as the subject is set in an executable state.

Figure 9:
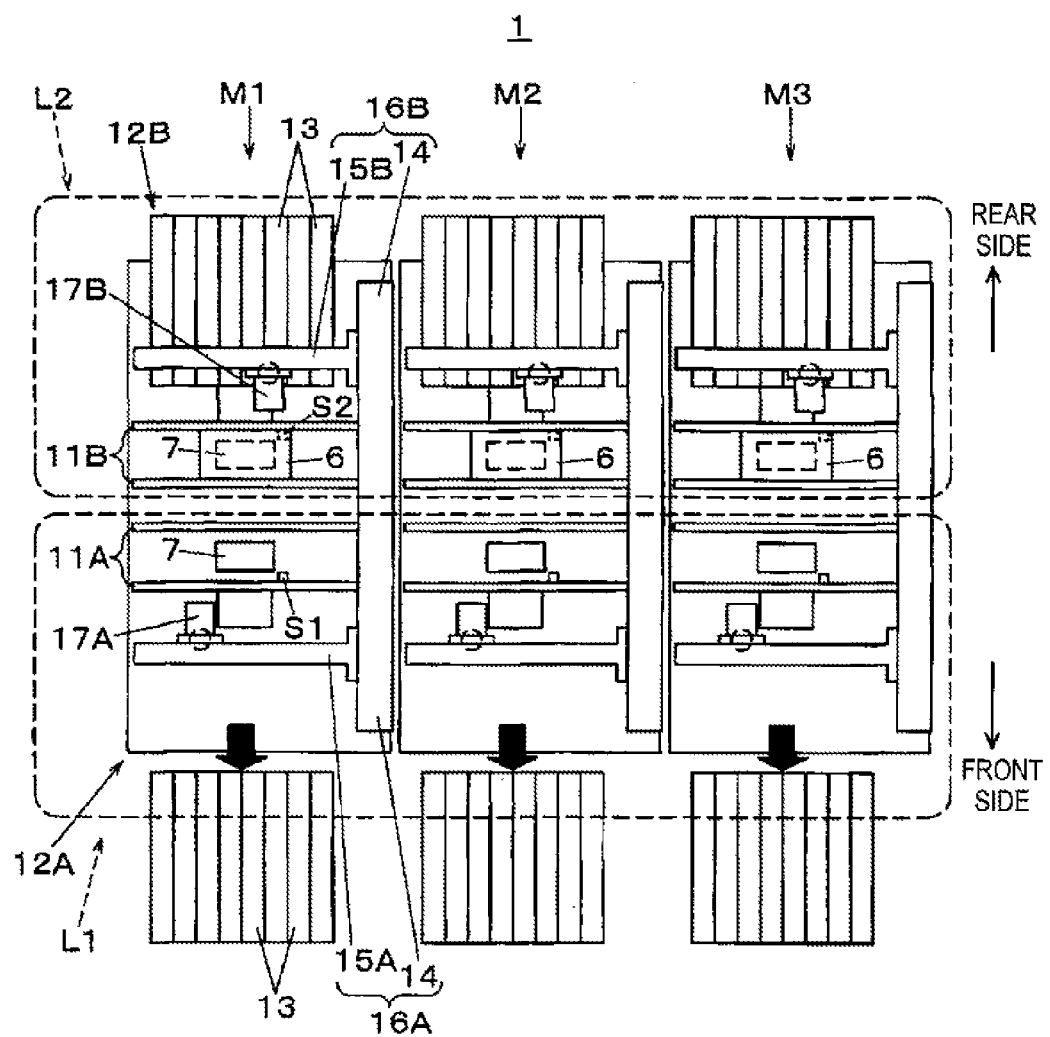
FIG. 9 is a diagram illustrating the operation sequence of the operation picture in the component mounting device in an embodiment of the present invention.

That is, as shown in FIG. 9, for the first mounting lane L1 as the subject of the product-type switching in the component mounting system 1, with regard to all of the component mounting devices M1 through M3, the multiple tape feeders 13 that have been installed on the bogie from the front-side component supplying section 12A are removed en bloc, and they are exchanged with the tape feeders 13 corresponding to the type of substrate of the next round of manufacturing. Adjustment of the transporting width of the front-side substrate transporting mechanism 11A and the operation for having the sucking nozzle installed on the front-side mounting head 17A correspond to the type of substrate for the next round of manufacturing are executed as needed. In addition, in the second mounting lane L2, for all of the component mounting devices M1 through M3, the substrates 6 transported by the rear-side substrate transporting mechanism 11B are taken as the subject, and the components fetched from the tape feeders 13 of the rear-side component supplying section 12B by the front-side mounting head 17A are mounted on the substrates 6 as the component mounting operation is continuously executed.

In this case, because the operation by the lane specifying switch 36 on the operation picture 30 is prohibited, the operation carried out via the operation picture 30 is limited to that with the first mounting lane L1 taken as the subject. As a result, there is no way for erroneous input of the second mounting lane L2 as the operation subject to occur due to an error made by the operator or the like, so that normal execution of the component mounting operation in the second mounting lane L2 can be guaranteed during the continuous manufacturing operation. That is, when a non-subject mounting lane other than the subject mounting lane is to perform the component mounting operation, the input control processing section 24 allows the input operation by the operation switches (the "file operation" 35e, the "component preparation" 35f, and the "manufacturing plan" 35g), and the input control processing is executed to prohibit the input operation by the lane specifying switch 36.

Figure 10:
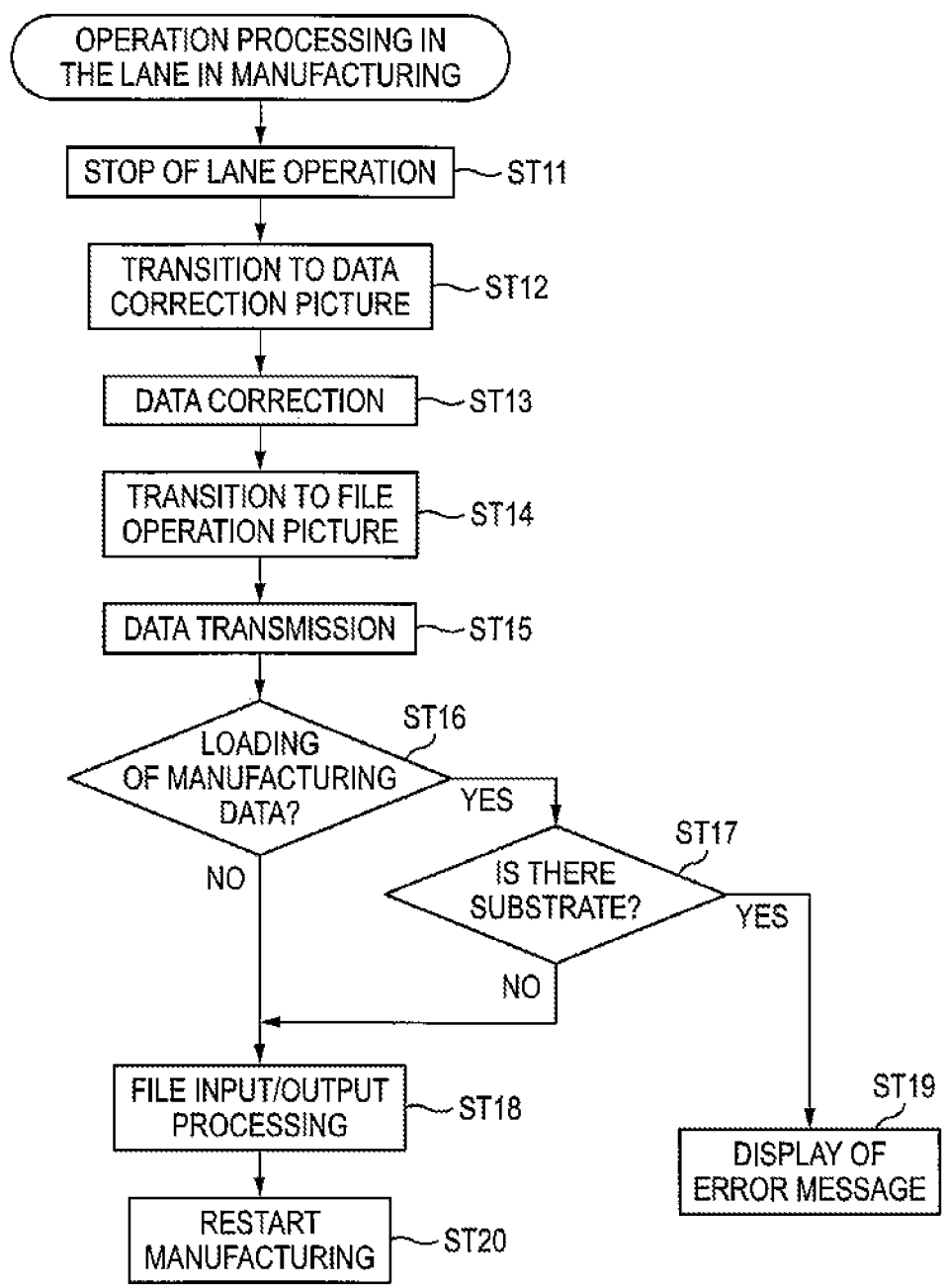
FIG. 10 is a flow chart illustrating the operation processing in the lane in the manufacturing operation in the component mounting device in an embodiment of the present invention.
Figure 11:
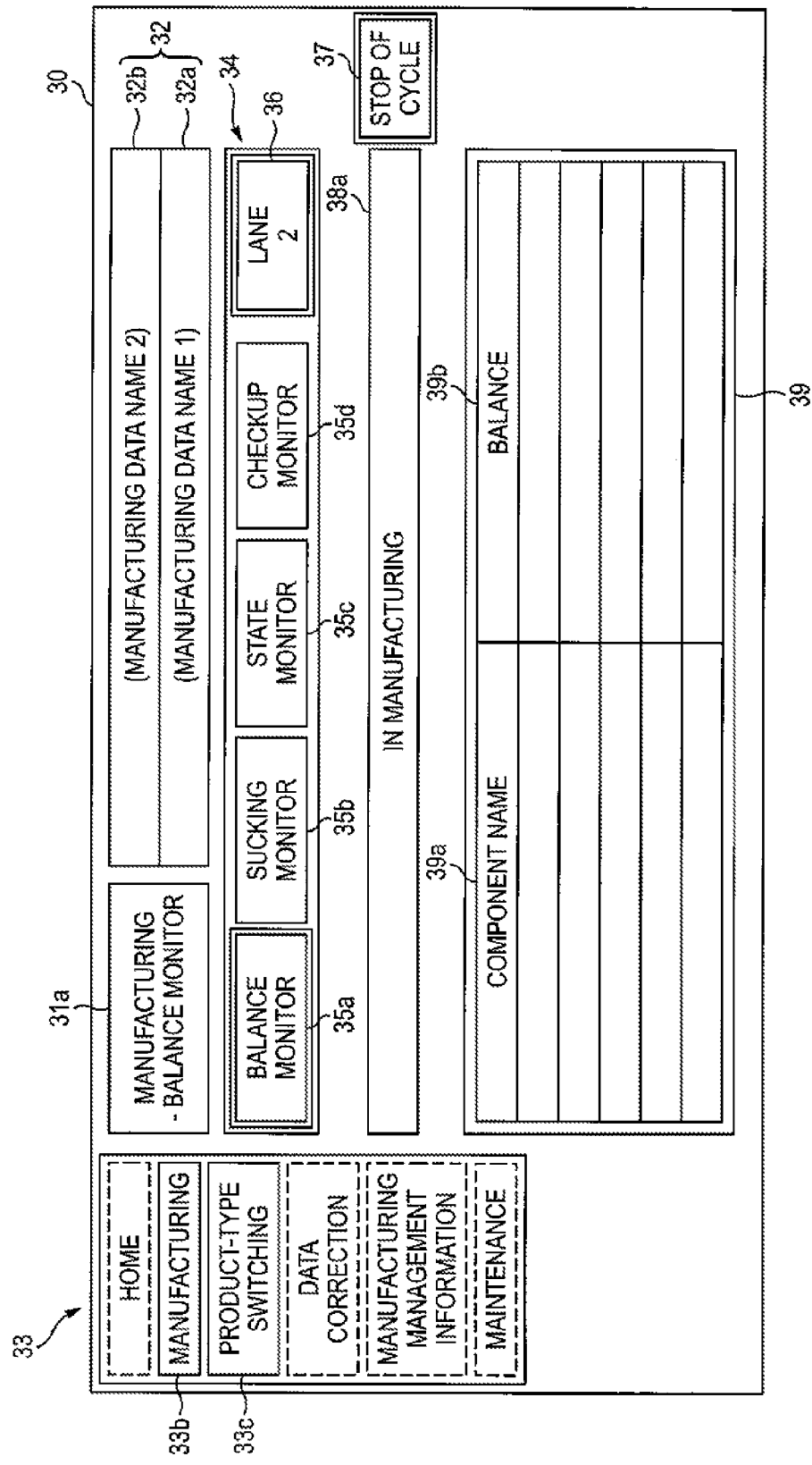
FIG. 11 is a diagram illustrating the operation sequence of the operation picture in the component mounting device in an embodiment of the present invention.

In the following, the operation processing executed with the mounting lane (the second mounting lane L2 in this example) during manufacturing in the component mounting system 1 will be explained. Here, FIG. 10 illustrates the case of data correction processing when a certain problem is found in the mounting operation data halfway in execution of the operation with a type of substrate as the subject. In the following, this processing will be explained. As shown in FIG. 10, the lane operation of the second mounting lane L2 as the subject of the data correction is stopped (ST11). That is, as shown in FIG. 11 on the operation picture 30, first of all, in the first operation switch frame 33, the "home" 33a is clicked to return to the manufacturing picture. Next, in the second operation switch frame 34, the lane specifying switch 36 for specifying the mounting lane as the subject of the product-type switching is clicked, so that the second mounting lane L2 is specified and, at the same time, the stop switch 37 is clicked. As a result, the movable mechanism on the side of the second mounting lane L2 of the component mounting devices M1 through M3 is stopped after the completion of 1 cycle of the component mounting operation in the second mounting lane L2, and the data correction operation with the second mounting lane L2 as the subject becomes executable.

Figure 12:
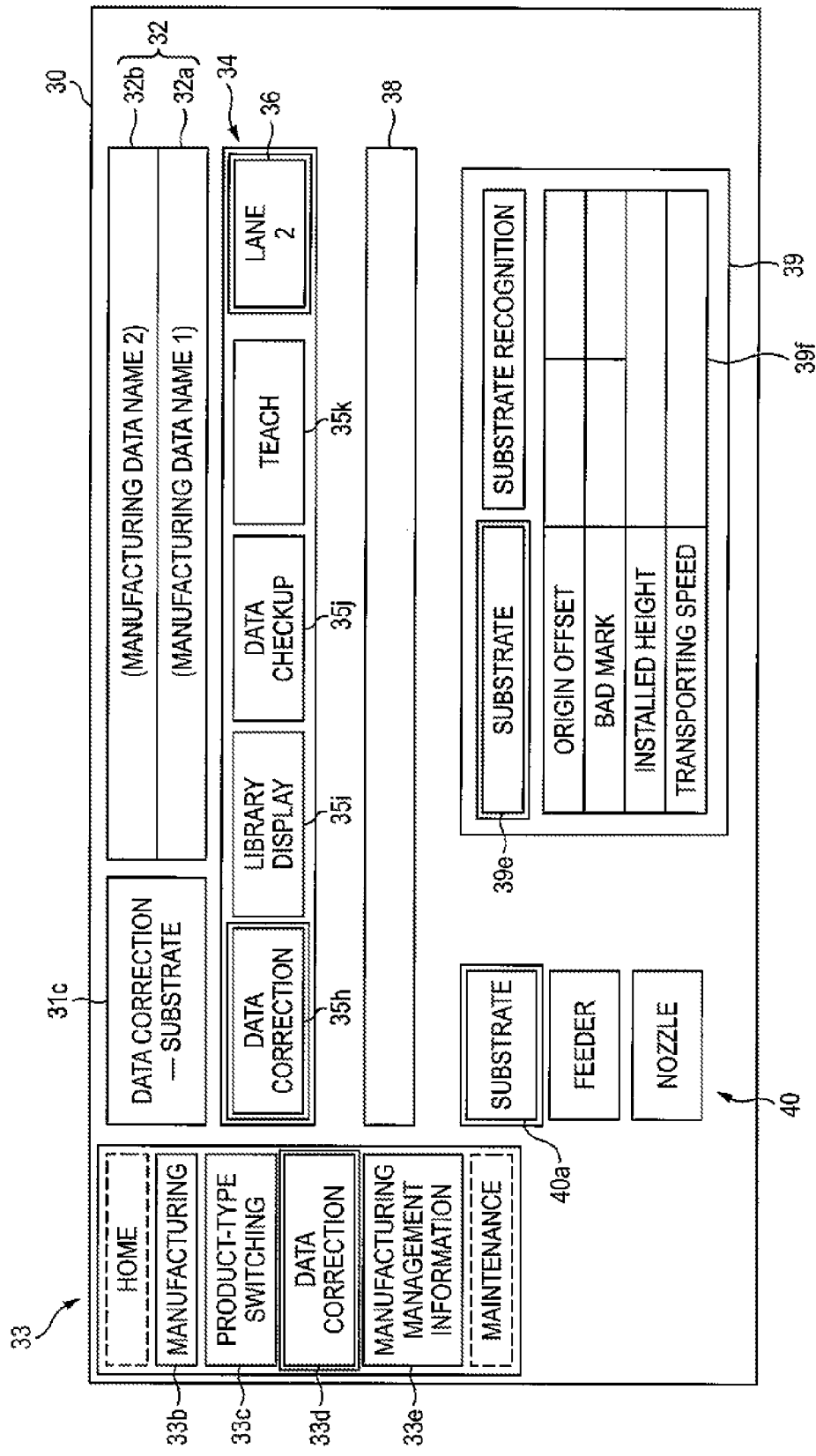
FIG. 12 is a diagram illustrating the operation sequence of the operation picture in the component mounting device in an embodiment of the present invention.

It then proceeds to the data correction picture (ST12). As shown in FIG. 12, by clicking "data correction" 33d in the first operation switch frame 33, the various types of operation switches related to the data reloading operation are displayed in the second operation switch frame 34. Here, the operation switches include the "data correction" 35h, the "library display" 35i, the "data checkup" 35j, the "teach" 35k, etc. At the same time, a list of classified items 40 is displayed as a large frame for the items as the subject of data correction below the message frame 38. In the list of classified items 40, the substrate 40a, the feeder, the nozzle, and other mechanical elements are classified and displayed. In the following, an example wherein the substrate 40a is selected will be explained.

As the substrate 40a is selected, in the information display area 39, together with the display of the "substrate" 39e indicating the substrate as the subject, a list 39f is also displayed. Here, the list includes the items of the origin offset, the bad mark, the height after installation, the transporting speed, and other characteristic values, parameters, and other data that should be assigned for execution of the component mounting operation. In the data correction operation, the necessary change values are then filed in the list 39f displayed on the operation picture 30 by the operator to carry out data correction (ST13).

Figure 13:
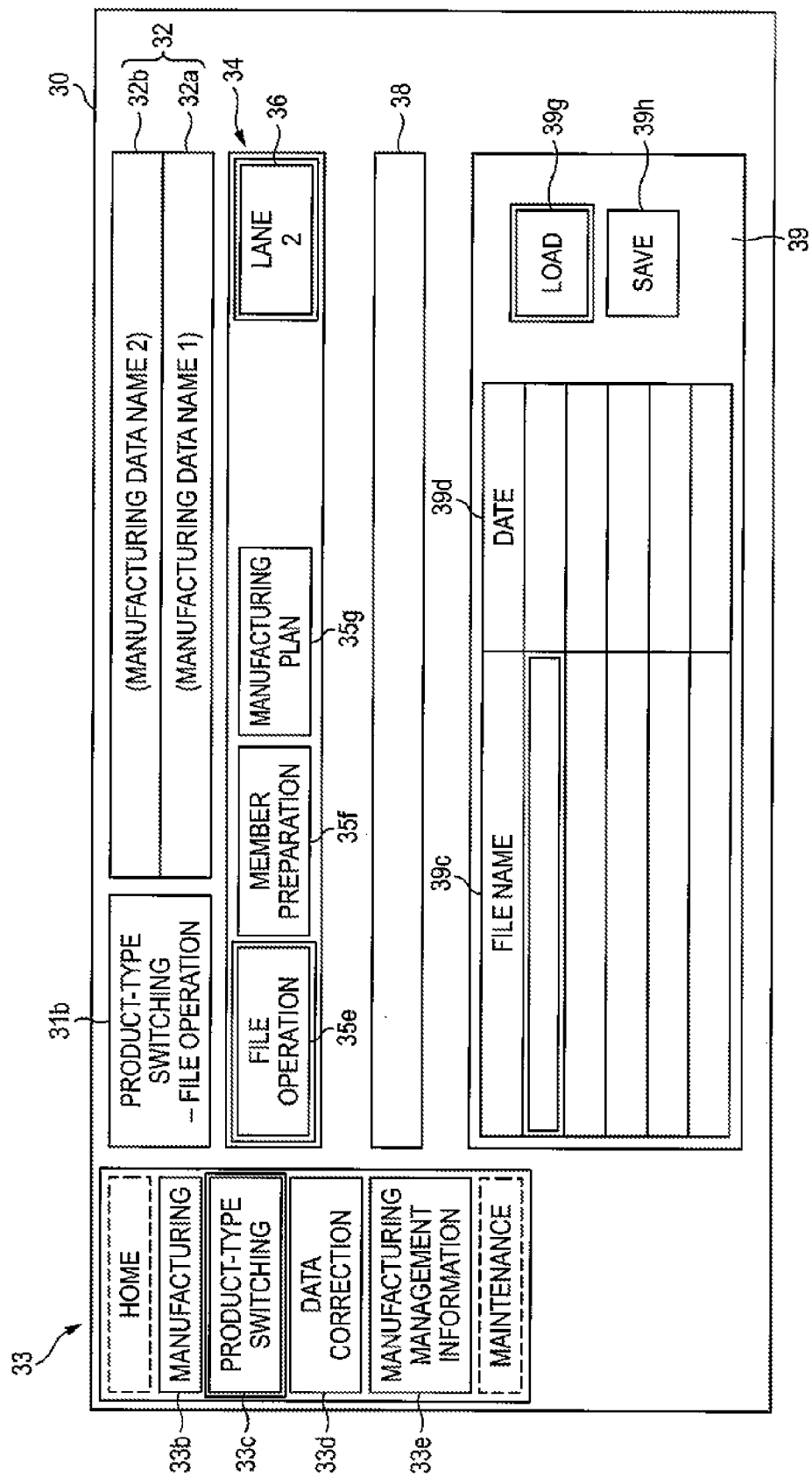
FIG. 13 is a plane view illustrating the component mounting system in an embodiment of the present invention.

It then proceeds to the file operation picture (ST14). That is, as shown in FIG. 13, suppose the lane operation is temporarily paused for data correction or the like during manufacturing in the second mounting lane L2, in the first operation switch frame 33, the "product-type switching" 33c is clicked, so that it can make a transition to the product-type switching picture. As a result, in addition to the items of the product-type switching picture shown in FIG. 8, the "load" 39g and the "save" 39h are also displayed as the operation switches for loading or saving the contents that were changed due to the data correction processing as shown in FIG. 12.

The changed contents are then sent as data to the controller 20 (ST15). Here, according to the contents of the data, a judgment is made on whether the manufacturing data corresponding to the individual types of substrate of the mounting program, etc., are loaded according to the contents of the data (ST16). Here, if the contents of the data sent are the manufacturing data related to switching of the type of substrate, a judgment is made on the presence/absence of substrate 6 in the rear-side substrate transporting mechanism 11B during the manufacturing operation on the basis of the result detected by the substrate presence/absence detecting sensor 52 in (ST17). Here, if the substrate presence/absence detecting sensor S2 detects the presence of a substrate, it is judged that in the second mounting lane L2, the component mounting operation being executed with one manufacturing lot as the subject has not ended yet: it is thus inappropriate to execute the operation for exchanging the type of substrate, and an error message is displayed on the display section 22. Next, if in (ST16), the data contents are not the manufacturing data, such as the mounting program, etc., or, if in (ST17), no substrate is detected, the input control processing section 24 executes the file input/output processing (ST18) and manufacturing in the mounting lane is restarted (ST20).

In the embodiment state, the input control processing section 24 carries out the following operation: if the substrate presence/absence detecting sensors S1, S2 detect the presence of substrates, it judges that the component mounting operation being executed in the mounting lane with one manufacturing lot as the subject has not ended, and it thus executes the input control processing for prohibiting the input operation by the operation switches for executing the operation related to exchange of the type of products to be manufactured.

That is, according to the product-type switching method in the component mounting device in this embodiment, there are the following steps of operation: a step in which the operator manipulates the operation panel 4 so that the lane specifying switch 36 is used to specify the subject mounting lane as the operation subject, an operation processing step for product-type switching wherein after the specified subject mounting lane is stopped, the "model switching" 33c (the product type switch) is clicked so that the various operation switches (the "file operation" 35e, the "component preparation" 35f, the "manufacturing plan" 35g) for executing the operation related to the product-type switching with the subject mounting lane as the subject are set in the operable state, and an operation execution step in which the operation related to the product-type switching is executed as the operation switch is clicked.

In the operation execution step, if the substrate presence/absence detecting sensors S1, S2 as the substrate presence/absence detecting sections detect the presence of substrates in the front-side substrate transporting mechanism 11A and rear-side substrate transporting mechanism 11B, it is judged that the manufacturing operation of the current manufacturing lot has not ended yet, so that the input control processing section 24 works to prohibit input operation by the operation switch for executing the operation related to the product-type switching. As a result, when the mounting lane is stopped during execution of manufacturing with a type of substrate taken as the subject, even when it is erroneously judged that the manufacturing lot has ended and the reloading operation of the manufacturing data related to the product-type switching is executed due to a certain mistake made by the operator, it is still possible to prevent the undesired reloading of the manufacturing data.

According to the present invention, as long as the gist and range of the present invention are observed, the specialists can make various changes and applications on the basis of the description of the specification as well as the well-known prior art, and this is included in the protected range too. Also, as long as the gist of the present invention is observed, the various composing requirements in the embodiments may be combined at will.

The present patent application is based on the Japanese patent application (Japanese Patent Application No. 2011-009655) filed on Jan. 20, 2011, and the contents of the Japanese Patent Application are included as a reference here.

INDUSTRIAL APPLICABILITY

The component mounting device and the product-type switching method of the present invention have the following effects: in a component mounting device having multiple mounting lanes, the product-type switching operation that occurs with a change in the type of substrates can be carried out without stopping the operation of one mounting lane and without hampering the safety of the operator, and this operation can be executed easily. The present invention is thus useful in the field of mounting of components on printed circuit substrates and for manufacturing mounted substrates.

DESCRIPTION OF REFERENCE NUMERALS AND SIGNS

1 Component mounting system
3 Operation panel
4 Operation panel
6 Substrate
7 Substrate holding section
11A Front-side substrate transporting mechanism (first substrate transporting mechanism)
11B Rear-side substrate transporting mechanism (second substrate transporting mechanism)
12A Front-side component supplying section (first component supplying section)
12B Rear-side component supplying section (first[sic: second] component supplying section)
14 Y-axis movable table
15A X-axis moving table
15B X-axis moving table
16A Front-side head moving mechanism (first head moving mechanism)
16B Rear-side head moving mechanism (second head moving mechanism)
17A Front-side mounting head (first mounting head)
17B Rear-side mounting head (second mounting head)
33c "Product-type switching" (product type switch)
36 Lane specifying switch
37 Stop switch
35e "File operation" (operation switch)
35f "Component preparation" (operation switch)
35g "Manufacturing plan" (operation switch)
L1 First mounting lane
L2 Second mounting lane
M1, M2, M3 Component mounting device

The invention claimed is:

1. A component mounting device, comprising:
  a first substrate transporting mechanism and a second substrate transporting mechanism, which transport the substrates received from an upstream device in a substrate transporting direction, and which have substrate holding sections that position and hold the substrates, respectively;
  a substrate presence/absence detecting section that detects presence/absence of substrates in the first substrate transporting mechanism and the second substrate transporting mechanism;
  a first component supplying section and a second component supplying section that are respectively arranged on sides of the first substrate transporting mechanism and the second substrate transporting mechanism, and which supply the components to be mounted on the substrates;
  a first component mounting mechanism and a second component mounting mechanism, which fetch the components from the first component supplying section and the second component supplying section arranged corresponding to the first substrate transporting mechanism and the second substrate transporting mechanism, respectively, and which have the components mounted on the substrates held in the substrate holding section of the first substrate transporting mechanism and the substrate holding section of the second substrate transporting mechanism, respectively;
  an operation panel which is operable to perform an input operation that is subjected for any of a first mounting lane including the first substrate transporting mechanism, the first component supplying section, and the first component mounting mechanism, and a second mounting lane including the second substrate transporting mechanism, the second component supplying section, and the second component mounting mechanism;
  operation switches which are arranged on the operation panel and include a lane specifying switch specifying a subject mounting lane as the subject of the input operation, a stop switch shutting off the operation of the device for the specified mounting lane, and a product-type switching switch carrying out a section exchange operation at the time of exchange of the type of substrate as the mounting subject; and
  an input control processing section that controls the input operation carried out via the operation switches;
  wherein, after the operator operates the operation panel to specify the subject mounting lane as the subject of the operation by the lane specifying switch and to stop the operation of the subject mounting lane that has been specified, the product-type switching switch is operated so that the input control processing section executes a product-type switching operation processing which sets the operation switches for executing operations related to the product-type switching to be ready for operation with the subject mounting lane as the subject; and
  when the product-type switching switch is operated, if the substrate presence/absence detecting section detects a presence of the substrates on a non-specified mounting lane other than the specified mounting lane, the input control processing section prohibits an operation of the lane specifying switch while a component mounting operation of the non-specified mounting lane continues.

2. A product-type switching method in a component mounting device comprising a first substrate transporting mechanism and a second substrate transporting mechanism, which transport the substrates received from an upstream device in a substrate transporting direction, and which have substrate holding sections that position and hold the substrates, respectively;
  a substrate presence/absence detecting section that detects presence/absence of substrates in the first substrate transporting mechanism and the second substrate transporting mechanism;
  a first component supplying section and a second component supplying section that are respectively arranged on sides of the first substrate transporting mechanism and the second substrate transporting mechanism, and which supply the components to be mounted on the substrates;
  a first component mounting mechanism and a second component mounting mechanism, which fetch the components from the first component supplying section and the second component supplying section arranged corresponding to the first substrate transporting mechanism and the second substrate transporting mechanism, respectively, and which have the components mounted on the substrates held in the substrate holding section of the first substrate transporting mechanism and the substrate holding section of the second substrate transporting mechanism, respectively;

an operation panel which is operable to perform an input operation that is subjected for any of a first mounting lane including the first substrate transporting mechanism, the first component supplying section, and the first component mounting mechanism, and a second mounting lane including the second substrate transporting mechanism, the second component supplying section, and the second component mounting mechanism; and operation switches which are arranged on the operation panel and include a lane specifying switch specifying a subject mounting lane as the subject of the input operation, a stop switch shutting off the operation of the device for the specified mounting lane, and a product-type switching switch carrying out a section exchange operation at the time of exchange of the type of substrate as the mounting subject, the method comprising:

a step in which the operator operates the operation panel to specify the subject mounting lane as the subject of the operation by the lane specifying switch;

a step carried out for product-type switching, in which after the operation of the subject mounting lane that has been specified is stopped, the product-type switching switch is operated so as to execute the product-type switching operation processing that sets the operation switches for executing the operations related to the product-type switching to be ready for operation with the mounting lane as the subject; and an operation execution step in which the operation switches are manipulated to execute the operation related to the product-type switching;

wherein, in the operation execution step, when the product-type switching switch is operated, if the substrate presence/absence detecting section detects a presence of the substrates on a non-specified mounting lane other than the specified mounting lane, the input control processing section prohibits an operation of the lane specifying switch while a component mounting operation of the non-specified mounting lane continues.

3. A component mounting device, comprising:

a first substrate transporting mechanism and a second substrate transporting mechanism, which transport the substrates received from an upstream device in a substrate transporting direction, and which have substrate holding sections that position and hold the substrates, respectively;

a substrate presence/absence detecting section that detects presence/absence of substrates in the first substrate transporting mechanism and the second substrate transporting mechanism;

a first component supplying section and a second component supplying section that are respectively arranged on sides of the first substrate transporting mechanism and the second substrate transporting mechanism, and which supply the components to be mounted on the substrates;

a first component mounting mechanism and a second component mounting mechanism, which fetch the components from the first component supplying section and the second component supplying section arranged correspondingly to the first substrate transporting mechanism and the second substrate transporting mechanism, respectively, and which have the components mounted on the substrates held in the substrate holding section of the first substrate transporting mechanism and the substrate holding section of the second substrate transporting mechanism, respectively;

an operation panel which is operable to perform an input operation that is subjected for any of a first mounting lane including the first substrate transporting mechanism, the first component supplying section, and the first component mounting mechanism, and a second mounting lane including the second substrate transporting mechanism, the second component supplying section, and the second component mounting mechanism;

operation switches which are arranged on the operation panel and include a lane specifying switch specifying a subject mounting lane as the subject of the input operation, a stop switch shutting off the operation of the device for the specified mounting lane, and a product-type switching switch carrying out a section exchange operation at the time of exchange of the type of substrate as the mounting subject; and an input control processing section that controls the input operation carried out via the operation switches;

wherein, after the operator operates the operation panel to specify the subject mounting lane as the subject of the operation by the lane specifying switch and to stop the operation of the subject mounting lane that has been specified, the product-type switching switch is operated so that the input control processing section executes a product-type switching operation processing which sets the operation switches for executing operations related to the product-type switching to be ready for operation with the subject mounting lane as the subject; and wherein, when the product-type switching switch is operated after the operation of the subject mounting lane is stopped by operating the lane specifying switch and the stop switch, if the substrate presence/absence detecting section detects presence of the substrate in the substrate transporting mechanism of the subject mounting lane, the input control processing section prohibits the operation switches from performing input operation for reloading operation of manufacturing data for the subject mounting lane from manufacturing data for producing a type of substrate currently produced by the subject mounting lane to manufacturing data for producing another type of substrate.

4. A product-type switching method in a component mounting device comprising a first substrate transporting mechanism and a second substrate transporting mechanism, which transport the substrates received from an upstream device in a substrate transporting direction, and which have substrate holding sections that position and hold the substrates, respectively;

a substrate presence/absence detecting section that detects presence/absence of substrates in the first substrate transporting mechanism and the second substrate transporting mechanism;

a first component supplying section and a second component supplying section that are respectively arranged on sides of the first substrate transporting mechanism and the second substrate transporting mechanism, and which supply the components to be mounted on the substrates;

a first component mounting mechanism and a second component mounting mechanism, which fetch the components from the first component supplying section and the second component supplying section arranged correspondingly to the first substrate transporting mechanism and the second substrate transporting mechanism, respectively, and which have the components mounted on the substrates held in the substrate holding section of the first substrate transporting mechanism and the substrate holding section of the second substrate transporting mechanism, respectively;

an operation panel which is operable to perform an input operation that is subjected for any of a first mounting lane including the first substrate transporting mechanism, the first component supplying section, and the first component mounting mechanism, and a second mounting lane including the second substrate transporting mechanism, the second component supplying section, and the second component mounting mechanism; and operation switches which are arranged on the operation panel and include a lane specifying switch specifying a subject mounting lane as the subject of the input operation, a stop switch shutting off the operation of the device for the specified mounting lane, and a product-type switching switch carrying out a section exchange operation at the time of exchange of the type of substrate as the mounting subject, the method comprising:

a step in which the operator operates the operation panel to specify the subject mounting lane as the subject of the operation by the lane specifying switch;

a step carried out for product-type switching, in which after the operation of the subject mounting lane that has been specified is stopped, the product-type switching switch is operated so as to execute the product-type switching operation processing that sets the operation switches for executing the operations related to the product-type switching to be ready for operation with the mounting lane as the subject; and an operation execution step in which the operation switches are manipulated to execute the operation related to the product-type switching;

wherein, in the operation execution step, when the product-type switching switch is operated after the operation of the subject mounting lane is stopped by operating the lane specifying switch and the stop switch, if the substrate presence/absence detecting section detects presence of the substrate in the substrate transporting mechanism of the subject mounting lane, the input control processing section prohibits the operation switches from performing input operation for reloading operation of manufacturing data for the subject mounting lane from manufacturing data for producing a type of substrate currently produced by the subject mounting lane to manufacturing data for producing another type of substrate.

* * * * *